(12) United States Patent
Hayakawa et al.

(10) Patent No.: US 6,921,620 B2
(45) Date of Patent: Jul. 26, 2005

(54) IMAGEABLE COMPOSITION CONTAINING COLORANT HAVING A COUNTER ANION DERIVED FROM A NON-VOLATILE ACID

(75) Inventors: Eiji Hayakawa, Tochigi-ken (JP); Jianbing Huang, Trumbull, CT (US); Thomas Jordan, Windsor, CO (US); Yasushi Miyamoto, Gunma-ken (JP); Jeffrey Collins, Greeley, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 37 days.

(21) Appl. No.: 09/933,884

(22) Filed: Aug. 21, 2001

(65) Prior Publication Data
US 2003/0113655 A1 Jun. 19, 2003

(51) Int. Cl.$^7$ .............................. G03F 7/021; G03F 7/30
(52) U.S. Cl. .................... 430/157; 430/176; 430/270.1; 430/302; 430/330
(58) Field of Search ................................. 430/157, 176, 430/270.1, 302, 330

(56) References Cited

U.S. PATENT DOCUMENTS

| 5,340,699 A | 8/1994 | Haley et al. ................. 430/302 |
| 5,536,616 A | 7/1996 | Frechet et al. .............. 430/191 |
| 5,641,608 A | 6/1997 | Grunwald et al. ........... 430/302 |
| 5,763,134 A | 6/1998 | Busman et al. ............. 430/157 |
| 5,919,601 A | 7/1999 | Nguyen et al. ........... 430/278.1 |
| 5,965,319 A | 10/1999 | Kobayashi ................... 430/176 |
| 6,042,987 A | 3/2000 | Kobayashi ................ 430/270.1 |
| 6,274,285 B1 * | 8/2001 | Gries et al. ................. 430/162 |
| 6,423,462 B1 | 7/2002 | Kunita |
| 2003/0082474 A1 * | 5/2003 | Haley et al. ................ 430/147 |

FOREIGN PATENT DOCUMENTS

| JP | 1078249 A2 | 3/1989 |
| JP | 3291665 A2 | 12/1991 |
| JP | 10039509 A2 | 2/1998 |
| JP | 10193554 A2 | 7/1998 |
| JP | 11268438 A2 | 10/1999 |

\* cited by examiner

Primary Examiner—John S. Chu
(74) Attorney, Agent, or Firm—Faegre & Benson LLP (57) ABSTRACT

The present invention provides an imageable composition, which includes an acid curable composition, an acid generator, a colorant having a counter anion derived from a non-volatile acid, and further optionally, an infrared absorber or photothermal converter material. The present invention further provides an imageable element, which includes a substrate and an imageable composition according to the present invention coated on a surface of the substrate. Also provided is method of producing an imaged element according to the present invention.

52 Claims, 1 Drawing Sheet

Figure 1

IMAGEABLE COMPOSITION CONTAINING COLORANT HAVING A COUNTER ANION DERIVED FROM A NON-VOLATILE ACID

BACKGROUND OF THE INVENTION

1. Field of the Invention

The present invention relates to an imageable composition. More particularly, the present invention relates to a thermally imageable composition having an acid curable composition, an acid generator, an infrared absorber and optionally, a colorant, such as, a colorant dye or a colorant pigment, provided that either the infrared absorber, the colorant or both have a counter anion derived from a non-volatile acid. Sulfonic acids can also be added to increase the speed of the thermally imageable, pre-heated, negatively working patterning compositions, which are useful especially in printing plates.

2. Description of the Prior Art

Printing plates having a coating of a thermally imageable composition that includes an acid curable composition and either a "free acid" cure catalyst or a "latent acid" cure catalyst, such as, an acid generator, are known. However, each of these systems suffers from disadvantages, which include difficulty of controlling the cure rates.

The difficulty of controlling cure rates becomes even more acute if the one or more ingredients of the thermally imageable composition have counter anions that are derived from a volatile acid. Thus, if an ingredient of the thermally imageable composition has a counter anion, such as, a halide ion derived from a volatile acid, the halide ion is converted to the volatile acid by combining with a proton under the strongly acidic cure conditions to produce the non-volatile acid. The volatile acid, for example, HF, HCl, HBr or HI, would then be easily volatilized and lost under the conditions of thermal imaging and subsequent baking, thereby reducing the cure rate. If "latent acid" cure catalyst having a counter anion derived from a volatile acid is used, the cure rate would also be reduced to unacceptably low levels because of the loss of the volatile acid under the conditions of thermal imaging and subsequent baking.

U.S. Pat. No. 5,965,319 and Japanese Patent Application JP 10-039,509 describe a negatively working composition having an IR absorber, novolak and resole resins, and an iodonium, sulfonium or diazonium salt, with a sulfonate group as counter ion. There is no teaching that the presence of sulfonic acid as a discrete additive or the presence of a dye having a counter anion derived from a non-volatile acid, such as, D11 dye, will improve cure rate and processing latitude.

U.S. Pat. No. 6,042,987 describes a thermal negative system in which an acid is produced from a typical generator upon exposure to IR radiation. This promotes cross-linking between a novolak and a crosslinking species.

Japanese Patent Application JP 11-268,438 describes a thermal positive plate having a novolak resin and an IR absorber that has a thermally decomposable sulfonate directly attached thereto. At unimaged regions of the plate, the absorber acts as an insolubiliser and, at imaged areas, it acts as a dissolution accelerant. Japanese Patent Application JP 10-193,554 describes a negative plate having excellent run length by virtue of a new, improved polymer. Japanese Patent Application JP 3-291,665 discloses conventionally imaged negative plate systems. There is no disclosure of dyes, such as, D11 dye, which has counter anions that combine with protons to produce non-volatile acids.

U.S. Pat. Nos. 5,340,699 and 5,919,601 describe imageable compositions having a binder, a crosslinker, an acid generator and an infrared absorber. These patents do not describe the use of a strong acid in addition to the acid generator or that added sulfonic acids would improve plate speed or processing latitude. Further, even though an IR dye having a p-toluene sulfonate anion is disclosed, it is not disclosed that this anion will improve plate speed or processing latitude by combining with a proton to produce a non-volatile acid.

U.S. Pat. No. 5,641,608 describes ablative and positive/negative solubility differential systems for PCB precursors. The negative systems rely on adding an amine active ingredient just prior to use, or by employing a "UV flood then IR exposure" process. U.S. Pat. No. 5,763,134 describes a composition having an acid generator, typically a triazine, and a squarylium dye having a defined nucleus. European Patent Application EP 632,003 describes MeO—and Me—containing phenol compounds for use as improved heat curing additives in conventional positive plates.

None of the above disclosures teach or suggest that the presence of a strong acid, such as, a sulfonic acid, and/or the presence of dyes, such as, D11 dye, which has counter anions that combine with protons to produce non-volatile acids, will improve cure rate and processing latitude when included in the composition.

Accordingly, it is an object of the present invention to improve the speed and processing latitude and robustness of thermal, pre-heated, negatively working patterning compositions, especially printing plates, while maintaining adequate shelf life.

The present invention provides such an imageable composition, which has an improved cure rate, processing latitude, processing robustness, long shelf life of the acid curable composition and moderate energy requirement of the acid generation step.

SUMMARY OF THE INVENTION

The present invention provides an imageable composition, which includes an acid curable composition, an acid generator, an infrared absorber and optionally, a colorant, wherein at least one of the infrared absorber and the colorant has a counter anion derived from a non-volatile acid.

The present invention further provides an imageable element, which includes a substrate and an imageable composition coated on a surface of the substrate. The composition includes an acid curable composition, an acid generator, an infrared absorber and optionally, a colorant, wherein at least one of the infrared absorber and the colorant has a counter anion derived from a non-volatile acid.

The present invention further provides a method of producing an imaged element. The method includes the steps of:

providing an imageable element including a substrate and an imageable composition coated on a surface of the substrate, the composition including an acid curable composition, an acid generator, an infrared absorber and optionally, a colorant, wherein at least one of the infrared absorber and the colorant has a counter anion derived from a non-volatile acid;

imagewise exposing the imageable element to radiation to produce an imagewise exposed element having exposed and unexposed regions;

baking the imagewise exposed element at a temperature and period of time sufficient to produce a cured element; and contacting the cured element and a developer to remove the unexposed regions and thereby produce the imaged element.

It was unexpectedly discovered that inclusion in the thermally imageable compositions of dyes, such as, D11 dye, which have counter anions that combine with protons to produce non-volatile acids, significantly improves cure rate and processing latitude of the composition. It was also found that incorporating a small amount of a sulfonic acid into pre-heat, thermal plate increases the speed of the thermal plate and allows maximum image density at wider pre-heat temperatures. It also provides significantly improved processing latitude while maintaining an adequate shelf life.

DETAILED DESCRIPTION OF THE INVENTION

Lithographic printing plate precursors, i.e., imageable elements, typically include a radiation imageable coating applied over a support material, such as, an aluminum substrate. If after exposure to radiation, the exposed regions of the coating become soluble and are removed in the developing process, revealing the underlying hydrophilic surface of the support, the plate is called a positive-working printing plate.

Conversely, if exposed regions of the plate become insoluble in the developer and the unexposed regions are removed by the developing process, the plate is called a negative-working plate. In each instance, the regions of the radiation-sensitive layer that remain (i.e., the image areas) are ink-receptive and the regions of the hydrophilic surface revealed by the developing process accept water and repel ink.

The present invention is useful in negative-working printing plates, such as, Thermal Printing Plates/830, available from Kodak Polychrome Graphics, Norwalk, Conn.

To improve cure rate and processing latitude of the thermally imageable layer, the present invention provides an imageable composition, which includes an acid curable composition, an acid generator and an infrared absorber having a counter anion derived from a non-volatile acid. In addition, the imageable composition can optionally include a strong acid, such as, a sulfonic acid as a discrete additive in the composition.

The term "hydrocarbyl" in the context of the present invention refers to a linear, branched or cyclic alkyl, alkenyl, aryl, aralkyl or alkaryl of 1 to 22 carbon atoms, substituted derivatives thereof, wherein the substituent group is selected from halogen, hydroxy, hydrocarbyloxy, carboxyl, ester, ketone, cyano, amino, amido and nitro groups. Hydrocarbyl groups in which the carbon chain is interrupted by oxygen, nitrogen or sulfur are also included in the term "hydrocarbyl".

Preferably, the imagable composition of the present invention is thermally imageable, so that the imageable element according to the present invention is infrared radiation imageable. Thus, in the method of the present invention, the step of imagewise exposing the imageable element to radiation is preferably carried out using an infrared radiation. Upon such imaging the developer solubility of the imaged area is decreased to allow differentiation between imaged and non-imaged areas upon development.

It has been found that replacing the current blue dye (Victoria Blue FBO) with D11 blue dye into pre-heat, thermal plate increases the speed of the thermal plate and allows maximum image density at wider pre-heat temperatures (improved processing latitude). It is believed that such improvements result from the presence of one or more components in the composition which contain anions derived from a non-volatile acid so that when such anions are combined with a proton, they produce a non-volatile acid, which cannot escape from the coating during processing.

The anions capable of producing a non-volatile acid might be donated from an IR dye, such as the following:

Alternatively, the anions capable of producing non-volatile acid might be provided from, for example, a blue colorant dye, such as D11 dye having the structure A shown below:

A

In the context of the present invention, the term "colorant" includes colorant dyes and colorant pigments.

The acid curable composition can include a binder and a crosslinking agent for that binder. Suitable binders include polymers that have at least two, preferably more than two reactive groups, such as, hydroxy, carboxylic acid, amine, carbamate, amide, sulfonamide or imide. Preferably, the reactive group is a hydroxy group, such that, the polymer can be a polyol, a polyether polyol, a novolak resin, a hydroxyfunctional acrylic resin, a hydroxyfunctional polyester resin and combination thereof.

The crosslinking agent can be any suitable crosslinking agent known in the art and includes crosslinking agents, such as, a resole resin, an amino resin, an amido resin, an epoxy compound having at least two epoxide groups and the like. A combination of the aforementioned crosslinkers can also be used.

The crosslinking agent preferably is an amino resin that has at least two alkoxymethyl groups, including amino resins, such as, an alkoxymethylated melamine resin, an alkoxymethylated benzoguanamine resin, an alkoxymethylated glycoluril, an alkoxymethylated polyacrylamid, an alkoxymethylated polymethacrylamid and a combination thereof. Preferably, the alkyl group in the alkoxymethylated amino resins is derived from an alcohol of 1 to 4 carbon atoms, such as methanol, ethanol, propanol, butyl alcohol, isomers thereof and mixtures thereof. Examples of such amino resins include alkoxymethylated melamine resins having from about 2 to about 6 methoxymethyl groups.

The acid curable composition can include a self-crosslinking material, such as, a resole resin. However, in addition to the resole resin, the acid curable composition can further include a polymer having at least two reactive groups, such as, hydroxy, carboxylic acid, amine, carbamate, amide, sulfonamide or imide, to form a crosslinked network with the resole resin. Preferably, the acid curable composition includes a resole resin and a novolak resin.

The acid curable composition can further contain an isocyanate crosslinker that has at least two, preferably more than two isocyanate groups. Such isocyanate crosslinkers include diisocyanates, such as, isophorone diisocyanate, methylene-bis-phenyl diisocyanate, toluene diisocyanate, hexamethylene diisocyanate, tetramethylxylylene diisocyanate, dimers thereof, adducts thereof with diols or triols, and mixtures thereof.

The imageable composition of the present invention also includes an acid generator, which is an ultraviolet, visible or infrared radiation or heat activated compound. Upon exposure to ultraviolet, visible radiation, infrared radiation or heat, either directly, or indirectly through heat transfer from an infrared absorbing compound, the acid generator produces a free acid, which acts as a cure catalyst for the curing process.

Suitable acid generators include onium salts, covalently bound sulfonate group containing compounds, hydrocarbylsulfonamido-N-hydrocarbyl sulfonate and a combination thereof. Examples of the covalently bound sulfonate group containing compounds include hydrocarbyl sulfonates, such as, methyl tosylate, ethyl tosylate, benzoin tosylate, and the like.

When an ultraviolet radiation is used with a thermally activated acid generator, the composition can further include a photothermal converter material for converting ultraviolet energy to thermal energy. In addition, a UV/visible sensitizer selected from monomolecular or polymeric compounds containing an anthracene moiety, thioxanthone moiety or alkylaminobenzophenone moiety can also be used. However, in the case of UV-activated acid generators, the use of a photothermal converter material is not necessary.

The term "volatile acid" in the context of the present invention refers to hydrogen halides such as HF, HCl, HBr and HI, which can escape from the imageable composition during imaging and/or baking steps. The term "non-volatile acid" in the context of the present invention refers to any non-halogen acid.

The use of counter anions derived from a non-volatile acid, which can combine with protons to produce non volatile acids increases the speed of thermally imageable, pre-heated, negatively working patterning compositions, especially printing plates.

Preferably, the acid generator is an onium salt that has a non-nucleophilic counter anion derived from a non-volatile acid, such as, sulfate, bisulfate, tetrafluoroborate, hexafluorophosphate, hexafluoroarsenate, hexafluoroantimonate, tetrakis(pentafluorophenyl)borate, triflate, pentafluoropropionate, pentafluoroethanesulfonate, benzenesulfonate, p-methylbenzenesulfonate and pentafluorobenzenesulfonate.

Examples of such onium salts include iodonium salts, sulfonium salts, hydrocarbyloxysulfonium salts, hydrocarbyloxyammonium salts, aryl diazonium salts and combinations thereof. Examples of the hydrocarbyloxy ammonium salts include the salts of N-hydrocarbyloxy substituted nitrogen containing heterocyclic compounds, such as, N-ethoxyisoquinolinium hexafluorophosphate. Examples of the iodonium salts include 4-octyloxyphenyl phenyliodonium hexafluoroantimonate.

Preferably, the acid generator is a monomeric or oligomeric aromatic diazonium salt. The monomeric and oligomeric diazonium salts can be any diazonium salt known in the art that is suitable for use in thermal imaging, provided that the diazonium salt has a counter anion that is other than halide.

Examples of such counter anions include sulfate, bisulfate, tetrafluoroborate, hexafluorophosphate, hexafluoroarsenate, hexafluoroantimonate, tetrakis (pentafluorophenyl)borate, triflate, pentafluoropropionate, pentafluoroethanesulfonate, benzenesulfonate, p-methylbenzene sulfonate and pentafluorobenzenesulfonate. Preferably, such diazonium salts are aromatic and more preferably, are derivatives of diphenylamine-4-diazonium salts, including, for example, for example, 4-diazodiphenylamine sulfate. Examples of such aromatic diazonium salts include: diphenyl-4-diazonium sulfate; 2-4-(N-(naphthyl-2-methyl)-N-propylamino)-benzenediazonium sulfate; chloro-diphenyl-4-diazonium sulfate; 4-(3-phenylpropylamino)-benzenediazonium sulfate; 4-(N-ethyl-N-(benzyl)-amino)-benzenediazonium sulfate; 4-(N,N-dmethyl-amino)-benzenediazonium tetrafluoroborate; 4-(N-(3-phenyl-mercapto-propyl)-N-ethyl-amino)-2-chlorobenzenediazonium sulfate; 4-(4-methylphenoxy)-benzenediazonium sulfate; 4-(phenylmercapto)-benzenediazonium sulfate; 4-phenoxybenzenediazonium sulfate; 4-(benzoylamino)-benzenediazonium hexafluorophosphate; methylcarbazole-3-diazonium sulfate; 3-methyl-diphenyleneoxide-2-diazonium sulfate, 3-methyldiphenylamine-4-diazonium sulfate, 2,3',5-trimethoxydiphenyl-4-diazonium sulfate; 2,4', 5-triethoxydiphenyl-4-diazonium sulfate; 4-(3-(3-methoxyphenyl)-propylamino)-benzenediazonium sulfate; 4-(N-ethyl-N-(4-methoxybenzyl)-amino)-benzenediazonium sulfate; 4-(N-(naphthyl-(2)-methyl)-N-n-propylamino)methoxybenzenediazonium sulfate; 4-(N-(3-phenoxypropyl)-N-methylamino)-2,5-dimethoxybenzenediazonium tetrafluoroborate; 4-(N-(3-phenylmercaptopropyl)-N-ethylamino)-2-chloro-5-methoxybenzenediazonium sulfate; 4-(4-(3- methylphenoxy)-phenoxy)-2,5-dimethoxybenzenediazonium sulfate; 4-(4-methoxyphenylmercapto)-2,5-diethoxybenzenediazonium sulfate; 2,5-diethoxy-4-phenoxybenzenediazonium sulfate; 4-(3,5-dimethoxybenzoylamino)-2,5-diethoxybenzenediazonium hexafluorophosphate; methoxycarbazole-3-diazonium sulfate; 3-methoxy-diphenyleneoxide-2-diazonium sulfate and methoxydiphenylamine-4-diazonium sulfate.

Diazonium salts derived from the following amines are also suitable for use in the present invention: 4-amino-3-methoxydiphenylamine, 4-amino-2-methoxydiphenylamine, 4'-amino-2-methoxydiphenylamine, 4'-amino-4-methoxydiphenylamine, 4-amino-3-ethoxydiphenylamine, 4-amino-3-hexyloxydiphenylamine, 4-amino-3-beta-hydroxyethoxydiphenylamine, 4'-amino-2-methoxy-5-methyldiphenylamine, 4-amino-3-methoxy-6-methyldiphenylamine, 4'-amino-4-n-butoxydiphenylamine, 4'-amino-3',4-dimethoxydiphenylamine, 4-amino-diphenylamine, 4-amino-3-methyl-diphenylamine, 4-amino-3-ethyldiphenylamine, 4'-amino-3-methyl-diphenylamine, 4'-amino-4-methyl-diphenylamine, 4'-amino-3,3'-dimethyldiphenylamine, 3'-chloro-4-amino-diphenylamine, 4-aminodiphenylamine-2-sulfonic acid, 4-aminodiphenylamine-2-carboxylic acid, 4-aminodiphenylamine-2'-carboxylic acid and 4'-bromo-4-aminodiphenylamine. Preferred are 4-amino-diphenylamine, 3-methyl-4-aminodiphenylamine, 3-alkoxy-4-aminodiphenylamines having 1 to 3 carbon atoms in the alkoxy group and 3-methoxy-4-aminodiphenylamine.

Preferably, the counter anion of the aromatic diazonium salt can be mesitylene sulfonate, toluene sulfonate, methane sulfonate, naphthalene sulfonate, trifluoromethane sulfonate, hexafluorophosphate and tetrafluoroborate.

Examples of the particularly preferred monomeric aromatic diazonium salts include 2-methoxy-4-phenylaminobenzenediazonium hexafluorophosphate (diazo MSPF6) represented by the formula:

2-methoxy-4-phenylaminobenzenediazonium p-toluenesulfonate represented by the formula:

and a combination thereof.

Examples of the particularly preferred oligomeric aromatic diazonium salts include compounds represented by the formula:

which is manufactured by St. Jean Photochemicals, Quebec, Canada, under the trade name DTS-18;

and wherein n is from 1 to 11; and a combination thereof. Mixtures of any of the aforementioned diazonium salts are also suitable.

In addition to the acid generator, the imageable composition of the present invention can optionally include a strong acid.

The term "strong acid" is defined herein as an acid that has a pKa of not more than about 8. Preferably, the strong acid of the present invention has a pKa of not more than about 5. More preferably, the strong acid of the present invention has a pKa of not more than about 4. Examples of such strong acids include sulfonic acids represented by the formula:

wherein R is a substituted or unsubstituted hydrocarbyl of 1 to 22 carbon atoms, a substituted or unsubstituted aryl of 6 to 22 carbon atoms. Mixtures of these acids can also be used to obtain desired cure rates and properties.

The alkyl sulfonic acids can be represented by the above formula, wherein the R group is preferably a linear, branched or cyclic alkyl of 1 to 22 carbon atom or a linear, branched or cyclic haloalkyl of 1 to 22 carbon atom having at least one halogen. Mixtures of these acids can also be used. Preferably, the haloalkyl group has two or more halogen atoms. Preferred halogens include chlorine and fluorine.

The aryl sulfonic acids can be represented by the formula:

wherein each of $R^1$, $R^2$, $R^3$, $R^4$ and $R^5$ can independently be hydrogen, an alkyl of 1 to 12 carbon atoms, a haloalkyl of 1 to 22 carbon atoms having at least one halogen, an aryl of 6 to 12 carbon atoms, a halogen, a hydroxy, an alkoxy, a cyano, a nitro, an alkoxycarbonyl or an acyl group represented by the formula:

wherein $R^6$ can be hydrogen, alkyl of 1 to 12 carbon atoms, haloalkyl of 1 to 12 carbon atoms having at least one halogen atom, alkoxy, cyano, nitro, alkoxycarbonyl and acetyl.

A preferred class of aryl sulfonic acids can be represented by the formula:

wherein each of $R^1$, $R^4$ and $R^6$ can be hydrogen, alkyl of 1 to 12 carbon atoms, haloalkyl of 1 to 12 carbon atoms having at least one halogen, aryl of 6 to 12 carbon atoms, halogen, hydroxy, alkoxy, cyano, nitro, alkoxycarbonyl or acyl and wherein $R^7$ can be hydrogen, alkyl of 1 to 12 carbon atoms, haloalkyl of 1 to 12 carbon atoms having at least one halogen, aryl of 6 to 12 carbon atoms, alkoxycarbonyl and acyl. An example of such an aryl sulfonic acid is 3-benzoyl-4-hydroxy-6-methoxybenzenesulfonic acid.

The imageable composition of the present invention includes an infrared absorber. Preferably, the infrared absorber has a counter anion derived from a non-volatile acid. Suitable infrared absorbers include pigments and dyes, or a combination thereof.

Examples of the preferred pigments include black pigments, yellow pigments, orange pigments, brown pigments, red pigments, purple pigments, blue pigments, green pigments, fluorescent pigments, metal powder pigments, polymer bond pigments, insoluble azo pigments, azo lake pigments, condensation azo pigments, chelate azo pigment, phthalocyanine pigments, anthraquinone pigments, perylene pigments, perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, carbon black, Paris Blue, Prussian Blue or any combination thereof.

Examples of the preferred dyes include cyanine dyes, squarylium dyes, pyrylium salts and nickel thiolate complexes.

A particularly useful class of infrared absorbing dyes include compounds represented by the formula:

wherein each $R^1$, $R^2$, $R^3$ and $R^4$ is independently selected from the group consisting of: a linear, branched or cyclic alkyl of 1 to 12 carbon atoms, alkenyl of 1 to 12 carbon atoms, alkoxy of 1 to 12 carbon atoms in the alkyl and aryl of 1 to 12 carbon atoms;

wherein each pair selected from the group consisting of: $R^1$ and $R^2$ and $R^3$ and $R^4$ may be bonded together to form a fused aromatic ring;

wherein each $R^5$, $R^6$, $R^7$, $R^8$, $R^9$ and $R^{10}$ is independently selected from the group consisting of: a linear, branched or cyclic alkyl of 1 to 12 carbon atoms, wherein each of said alkyls can independently have a substituent;

wherein each $R^{11}$, $R^{12}$ and $R^{13}$ is independently selected from the group consisting of: hydrogen halogen, a linear, branched or cyclic alkyl of 1 to 8 carbon atoms, wherein each of said alkyls can independently have a substituent; wherein $R^{12}$ may be bonded to $R^{11}$ or $R^{13}$ to form a ring structure; and when m is greater than 2, a plurality of $R^{12}$ may bonded to each other to form a ring structure;

wherein each $R^{14}$ and $R^{15}$ is independently selected from the group consisting of: hydrogen halogen, a linear, branched or cyclic alkyl of 1 to 8 carbon atoms, wherein each of said alkyls can independently have a substituent; wherein $R^{14}$ may be bonded to $R^{15}$ to form a ring structure; and when m is greater than 2, a plurality of $R^{14}$ may bonded to each other to form a ring structure; and wherein m is an integer from 1 to 8; and X⁻ is a counter anion derived from either a volatile or a non-volatile acid.

Preferably, the counter anion in the above infrared absorbing dyes is derived from a non-volatile acid. However, the infrared absorbing dyes can have counter anions derived from a volatile acid if the colorant, such as, the colorant dye or the colorant pigment, which can also be present in the composition, has a non-volatile counter anion. Thus, if both an infrared absorbing dye and a colorant are present in the composition, at least one of the two, i.e., either the infrared absorber or the colorant, must have a counter anion derived from a non-volatile acid. However, if only an infrared absorbing dye is present in the composition, then the infrared absorbing dye must have a counter anion derived from a non-volatile acid.

Specific examples of dyes having a counter anion derived from a non-volatile acid include the following compounds:

(1)

(2)

(3)

(4)

and (5)

These dyes have the property of generating heat upon absorbing light. Furthermore, they have an infrared absorb band in the range from 700 to 1200 nm and thus, are suitable for use in the imageable compositions of the present invention.

Further examples of dyes and pigments include triarylamine dyes, thiazolium dyes, indolium dyes, oxazolium dyes, cyanine dyes, polyaniline dyes, polypyrrole dyes, polythiophene dyes, thiolene metal complex dyes, carbon black and polymeric phthalocyanine blue pigments and those that are mentioned in U.S. Pat. Nos. 5,919,601; 3,218,167; and 3,884,693, the contents of which are incorporated herein by reference in their entirety as fully set forth.

The present invention also provides an imageable element, which employs the imageable composition of the present invention. The imageable element includes a substrate and an imageable composition according to the present invention coated on a surface of the substrate.

The substrate of the imageable element is typically an aluminum sheet. However, other materials that are commonly known to those skilled in the art can also be used.

Suitable substrates include any sheet material conventionally used to prepare lithographic printing plates, including metals such as aluminum sheets; paper; paper coated on one or both sides with an alpha-olefin polymer such as polyethylene; acetate films such as polyvinyl acetate and cellulose acetate film; polyvinyl acetal film; polystyrene film; polypropylene film; polyester film such as polyethylene terephthalate film; polyamide film; polyimide film; nitrocellulose film; polycarbonate film; polyvinylchloride film; composite films such as polyester, polypropylene or polystyrene film coated with polyethylene film; metalized paper or films; metal/paper laminates; Perlon gauze; plates of magnesium, zinc, copper, anodized aluminum, electrochemically roughened aluminum, steel, and the like.

A preferred substrate for the imageable element of present invention is an aluminum sheet. The surface of the aluminum sheet may be treated with metal finishing techniques known in the art including physical roughening, electrochemical roughening, chemical roughening, anodizing, and silicate sealing and the like.

The preferred aluminum substrate is electrochemically-grained and anodized aluminum, such as commonly used for lithographic printing plates. Anodized substrates can be prepared using sulfuric acid anodization, phosphoric acid anodization or a combination thereof. Other conventional anodization methods can also be used in the preparation of the anodized substrate of the present invention.

The imageable layer can be applied using the application methods known in the art. For example, the imageable composition can be dissolved in solvents, preferably organic solvents, and applied to an aluminum substrate, which has been preferably grained, anodized and post-treated. Graining (or roughening) can be accomplished by mechanical or electrochemical processes or by a combination of both processes.

Preferred post-treatments include silication and polyvinyl phosphonic acid. Post-treatment with phosphate or phosphate/fluoride, followed by silication, can also be used.

After proper drying, the coating weight of the imaging layer preferably is in the range of about 0.2 to about 5.0 g/m$^2$, and more preferably in the range from about 0.7 to about 2.5 g/m$^2$.

The imageable element of the present invention is suitable for use in single as well as multilayer imageable elements that are useful in lithographic printing, including lithographic printing plates that can be thermally imaged by imagewise exposure with a laser or a thermal printing head. The multilayer imageable element is useful as a precursor for a lithographic printing member.

In addition to the imageable layer, the imageable element can have additional layers, such as, an underlying layer.

Possible functions of an underlying layer include:

(1) to enhance developability of the imagewise unexposed areas; and (2) to act as a thermal insulating layer for the imagewise exposed areas.

Such thermal insulating polymeric layer prevents otherwise rapid heat dissipation, for example, through the heat conducting aluminum substrate. This allows more efficient thermal imaging throughout of the imageable layer, particularly in the lower sections. In accordance with these functions, the underlying layer should be soluble or at least dispersible in the developer and, preferably, have a relatively low thermal conductivity coefficient.

The imageable element can further have an overlying layer. Possible functions of an overlying layer include:

(1) to prevent damage, such as scratching, of the surface layer during handling prior to imagewise exposure; and (2) to prevent damage to the surface of the imagewise exposed areas, for example, by over-exposure, which could result in partial ablation.

The overlying layer should be soluble, dispersible or at least permeable to the developer.

In a multilayer thermally imageable case, the element has a bottom layer including a polymeric material which can be removed by treatment with an aqueous alkaline solution, and a top layer having the imageable layer of the present invention which upon imaging exhibits a decreased solubility of the exposed regions in an aqueous developer solution, i.e., is negative working.

Further, known plasticizers, adhesion promoters, flow control agents and/or UV absorbers can be added to the copying compositions of the invention. The type and quantity of such additives depend on the purpose for which the imageable element according to the present invention is intended for use. In any case, however, care must be taken that the substances added do not absorb an excessive proportion of the radiation required for acid generation and thus reduce the crosslinking sensitivity of the composition.

Suitable plasticizers include dibutyl phthalate, diisooctyladipate, nitro esters, alkyl and aryl phosphate esters, chlorinated paraffins. Glycols or aliphatic polyols can also be added. If it is desired to ensure good storability under relative high atmospheric moisture conditions, the use of water-insoluble plasticizers is preferred.

Adhesion promoters can also be added. Suitable adhesion promoters include monomeric or polymeric organic silanes, nitrogen-containing heterocyclic compounds, such as those disclosed in U.S. Pat. Nos. 3,645,722, 3,622,234, and 3,827,908, heterocyclic mercaptan compounds, mercapto alkanoic acid anilides and mercapto alkanoic acid esters.

The present invention also provides a method of producing an imaged element, which includes the steps of:

providing an imageable element including a substrate and an imageable composition coated on a surface of the substrate, the composition including an acid curable composition, an acid generator, an infrared absorber and optionally, a colorant, wherein at least one of the infrared absorber and the colorant has a counter anion derived from a non-volatile acid;

imagewise exposing the imageable element to radiation to produce an imagewise exposed element having exposed and unexposed regions;

baking the imagewise exposed element at a temperature and period of time sufficient to produce a cured element; and contacting the cured element and a developer to remove the unexposed regions and thereby produce the imaged element.

The method can be practiced by imagewise exposing the imageable element to ultraviolet radiation provided that the thermally imageable composition includes a photothermal converting material. The exposing step of this method is preferably carried out using an infrared laser. However, other methods such as visible or UV laser imaging may also be used, provided that a photoconverter, i.e., a photothermal converter, is present. Thus, for exposure with such visible or UV radiation sources, the imageable composition generally includes a photothermal converting material.

The printing plates, forms, screens, resists and the like, are prepared in the customary manner from the appropriate materials. After exposure, the non-image areas of the layer, which have retained their solubility, are removed by treatment with a suitable developer, such as, an aqueous acid or base solution.

The imaging layer of the imageable element is negative working. Preferably, the imaging layer is thermally imageable, so that the imageable element according to the present invention is infrared radiation imageable. Thus, in the method of the present invention, the step of imagewise exposing the imageable element to radiation is carried out using an infrared radiation. Upon such imaging the developer solubility of the imaged area is decreased to allow differentiation between imaged and non-imaged areas upon development.

Following imagewise exposure by analog or digital means, an imaged element having exposed areas and complimentary unexposed areas is obtained. Thereafter, the exposed plate precursor is baked at a temperature from about 220° F. to about 280° F., preferably from about 240° F. to about 260° F. for a period of time from about 45 seconds to about 75 seconds, preferably from about 55 seconds to about 65 seconds. The exposed plate precursor is then developed with a developer capable of selectively removing the uncrosslinked materials in the unexposed regions.

The developer composition is dependent on the nature of the polymeric substance, but is preferably an aqueous composition. Common components of aqueous developers include surfactants, chelating agents, such as, salts of ethylenediamine tetraacetic acid, organic solvents, such as, benzyl alcohol, ethylene glycol monomethyl ether, ethylene glycol monoethyl ether, diacetone alcohol, butyl acetate, ethylene glycol methyl ether acetate, methyl isobutyl ketone and a mixture thereof, and alkaline components, such as organic amines, including alkanol amines, such as triethanol amine and methyl diethanol amine, inorganic metasilicates, organic metasilicates, hydroxides and bicarbonates.

The pH of the aqueous developer is preferably within about 5 to about 14, depending on the nature of the composition of the imaging layer. The development can be performed by any known manner, for instance, by rubbing the plate surface with a developing pad containing the foregoing developer or by pouring the developer on the plate surface and then rubbing the surface with a developing brush in water.

The inventors have surprisingly discovered that incorporating a small amount of a sulfonic acid into pre-heat, thermal plate increases the speed of the thermal plate and allows maximum image density at wider pre-heat temperatures. In addition, it provides significantly improved processing latitude while maintaining an adequate shelf life.

For example, when an experiment was completed adding 0 to 1% 3-benzoyl-4-hydroxy-6-methoxybenzenesulfonic acid (HMBS) into a series of coatings for thermal pre heat plates, dramatic increases in speed were found at 0.04% level. In addition the formulation had a 30 to 40° F. pre heat window. With pre heat plates including the 3-benzoyl-4-hydroxy-6-methoxybenzene sulfonic acid (HMBS), plate speed was around 80 MJ/cm$^{-2}$ with a 250° F. pre-heat temperature, when the plate system was developed in MX1710.

The present invention further provides an improved formulating scope. Previous attempts to improve speed and fog control have had deleterious effects on plate performance. Thus, if one is able to prepare a fast plate, a plate having a poor shelf life is obtained. Conversely, if a plate having a good shelf life is prepared, a slow plate is obtained. In contrast, the present invention provides a substantial improvement in the speed and processing robustness of thermal, pre-heated, negatively working patterning compositions, such as, printing plates, forms, screens, resists, and the like, while maintaining adequate shelf life, improvements in plate speed and increased processing latitude of thermal, pre-heat negative plates.

The invention is further described in the following examples, which are intended to be illustrative and not limiting.

EXAMPLES

The following are referred to hereinafter:

(1) Resin A—a resole resin, UCAR phenolic resin BKS-5928 as supplied by Union Carbide Corporation.

(2) Resin B—a novolak resin, N13 as supplied by Eastman Kodak Company.

(3) Acid generator A—Diazo MSPF6 as supplied by Diversitec Corporation, Fort Collins, Colo. having the following structure:

(4) IR dye A—having the following structure:

(5) Blue dye A—Simbase Victoria Blue FBO 23363, as supplied by Charkit Chemical Corporation, Darien, Conn.

(6) Terephthaldehyde as supplied by Aldrich Chemical Company, Milwaukee, Wis.

(7) Blue Dye B—D11 dye having the structure:

(8) Substrate—0.3 mm thick sheets of aluminum that had been electrograined, anodised and post-anodically treated with an aqueous solution of an inorganic phosphate.

(9) Developer A—9005+ as supplied by Kodak Polychrome Graphics.

(10) Creo trendsetter 3244: a commercially available platesetter, operating at a wavelength of 830 nm, as supplied by Creo products of Canada.

(11) Gretag Macbeth D19C densitometer: a commercially available densitometer as supplied by Color data systems Limited of the Wirral, UK.

Examples C1, 1 and 2

Coating formulations comprised solutions of the components described in table 1 in 1-methoxypropan-2-ol/acetone 92:8 (w:w). Plates were prepared by coating the formulations onto the aluminum substrate by means of a whirl coater. The formulation concentrations were selected to provide dry films having a coating weight of 120 mg/ft. The coated plates were dried at 100° C. for 90 seconds. The film weights were measured after thorough air drying over several days.

TABLE 1

| Component | Example | | |
|---|---|---|---|
| | C1 | 1 | 2 |
| | Parts by Weight | | |
| Resin A | 28.2 | 28.2 | 28.0 |
| Resin B | 48.3 | 48.3 | 47.9 |
| Acid Generator A | 7.5 | 7.5 | 7.4 |
| IR Dye A | 8.6 | 8.6 | 8.5 |
| Terephthaldehyde | 6.5 | 6.5 | 6.4 |
| Blue Dye A | 0.9 | | 0.9 |
| Blue Dye B | | 0.9 | 0.9 |

Ascertaining Fog Point:

Unimaged plate samples were placed in a heavy duty Wisconsin oven (conveyor speed=2.5 feet/min) starting at a temperature of 275° F. and decreasing by 5° F. intervals. After processing in a Mercury Mark V processor (containing 9005+ developer at 25° C., processing speed 740 mm/min) the plates were visually appraised for any remaining green coating. The point at which the plates became completely free of coating was noted. In this case, this was 268° F. for all examples.

Thermal Exposure:

Additional plate samples were then imaged on the Creo Trendsetter at 54, 63, 76, 95, 127 and 190 mJ/cm$^{-2}$, using an internal solid image pattern (100% exposure). They were then pre-heated in the Wisconsin oven as above, at 258° F. (10° F. below fog point), and processed in the Mercury processor as above.

The completed plates were assessed in 2 ways:

(a) The solid density ($D_{max}$) of the thermally exposed, pre-heated and developed coating was measured using an X-rite 408 densitometer (b) The plates were visually appraised for banding (variations in the solid coating from dark to light green caused by incomplete cross-linking of the coating during pre-heating).

Figure 1:
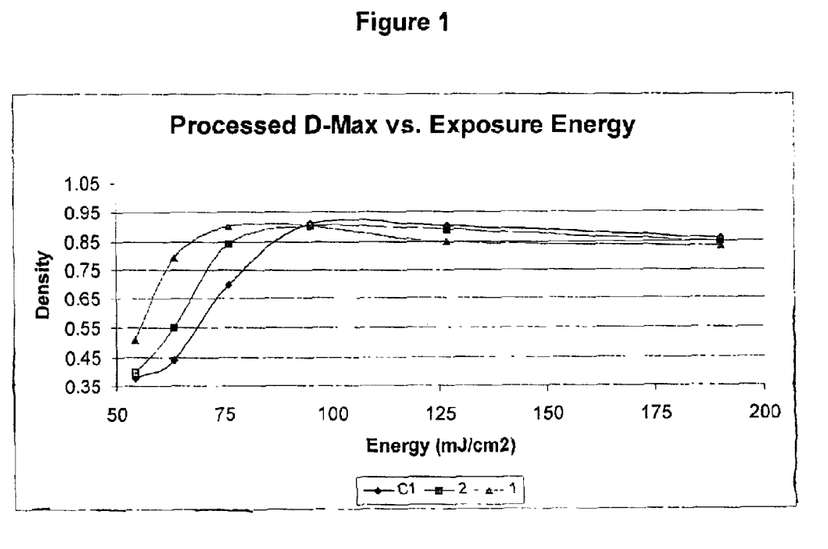
FIG. 1 depicts a plot of Solid Density ($D_{max}$) of thermally exposed, pre-heated and developed plates versus Exposure Energy ($mJ/cm^{-2}$).

Results:

Table 2 shows the presence of D11 dye reduces the amount of imaging energy required to produce an exposed negative working coating. The results are expressed graphically in FIG. 1. Table 3 shows the presence of D11 dye, increases the resistance to banding.

TABLE 2

| Example | $D_{max}$ at stated imaging energy density (mJ/cm$^{-2}$) | | | | | |
|---|---|---|---|---|---|---|
| | 54 | 63 | 76 | 95 | 127 | 190 |
| C1 | 0.38 | 0.44 | 0.70 | 0.91 | 0.90 | 0.86 |
| 1 | 0.51 | 0.79 | 0.90 | 0.90 | 0.85 | 0.83 |
| 2 | 0.40 | 0.55 | 0.84 | 0.90 | 0.89 | 0.85 |

TABLE 3

| Example | Presence of banding | | | | | |
|---|---|---|---|---|---|---|
| | 54 | 63 | 76 | 95 | 127 | 190 |
| C1 | yes | yes | yes | yes | no | no |
| 1 | yes | yes | no | no | no | no |
| 2 | yes | yes | yes | no | no | no |

Examples C2 and 3

Coating formulations comprised solutions of the components described in Table 4 in 1-methoxypropan-2-ol/acetone 92:8 (w:w).

TABLE 4

| Component | Example | |
|---|---|---|
| | C2 | 3 |
| | Parts by Weight | |
| Resin A | 28.6 | 28.6 |
| Resin B | 48.4 | 48.4 |
| Acid Generator A | 7.5 | 7.5 |
| IR Dye A | 7.8 | 7.8 |
| Terephthaldehyde | 6.5 | 6.5 |
| Blue Dye A | 1.2 | |
| Blue Dye B | | 1.2 |

Plates were prepared by coating the formulations onto the aluminum substrate by means of a whirl coater. The formulation concentrations were selected to provide dry films having a coating weight of 120 mg/ft. The coated plates were dried at 100° C. for 90 seconds. The film weights were measured after thorough air drying over several days.

Ascertaining Fog Point:

Unimaged plate samples were placed in a heavy duty Wisconsin oven (conveyor speed=2.5 feet/min) starting at a temperature of 275° F. and decreasing by 5° F. intervals. After processing in a Mercury Mark V processor (containing 9005+ developer at 25° C., processing speed 740 mm/min) the plates were visually appraised for any remaining green coating. The point at which the plates became completely free of coating was noted. In this case, this was 279° F. for example C2 and 271° F. for Example 3.

Thermal Exposure:

Additional plate samples were then imaged on the Creo Trendsetter at 74, 79, 84, 90, 95, 100, 105, 111, 116, 121, 126, 132, 137, 142, 148, 153, 158 and 163 mJ/cm$^{-2}$, using an internal solid image pattern (100% exposure). They were then pre-heated in the Wisconsin oven as above, at 2, 7, 12, 17 and 22° F. below the relevant fog point, and were processed in the Mercury processor as above.

The completed plates were assessed for banding (Table 5). It can be seen that the presence of D11 dye increases the resistance to banding.

TABLE 5

| Imaging Energy | Presence of banding | | | | | | | | |
|---|---|---|---|---|---|---|---|---|---|
| Density | 2° F. below fog | | 7° F. below fog | | 12° F. below fog | | 17° F. below fog | | 22° F. below fog |
| mJcm$^{-2}$ | C2 | 3 | C2 | 3 | C2 | 3 | C2 | 3 | C2 | 3 |
| 74 | Yes | Slight | Yes | Yes | Yes | Yes | Yes | Yes | Yes | Yes |
| 79 | Yes | No | Yes | Slight | Yes | Yes | Yes | Yes | Yes | Yes |
| 84 | Yes | No | Yes | No | Yes | Slight | Yes | Yes | Yes | s |
| 90 | Yes | No | Yes | No | Yes | No | Yes | Yes | Yes | Yes |
| 95 | Yes | No | Yes | No | Yes | No | Yes | No | Yes | Slight |
| 100 | Slight | No | Yes | No | Yes | No | Yes | No | Yes | Slight |
| 105 | No | No | Slight | No | Yes | No | Yes | No | Yes | Slight |
| 111 | No | No | No | No | Yes | No | Yes | No | Yes | No |
| 116 | No | No | No | No | Slight | No | Slight | No | Yes | No |
| 121 | No | No | No | No | No | No | Slight | No | Yes | No |
| 126 | No | No | No | No | No | No | Slight | No | Yes | No |
| 132 | No | No | No | No | No | No | Slight | No | Yes | No |
| 137 | No | No | No | No | No | No | Slight | No | Yes | No |
| 142 | No | No | No | No | No | No | Slight | No | Yes | No |
| 148 | No | No | No | No | No | No | Slight | No | Yes | No |
| 153 | No | No | No | No | No | No | Slight | No | Yes | No |
| 158 | No | No | No | No | No | No | No | No | Yes | No |
| 163 | No | No | No | No | No | No | No | No | Slight | No |

Examples 4 to 8

Coating formulations comprised solutions of the components described in table 6 in 1-methoxypropan-2-ol/acetone 92:8 (w:w). Plates were prepared by coating the formulations onto the aluminum substrate by means of a whirl coater. The formulation concentrations were selected to provide dry films having a coating weight of 120 mg/ft. The coated plates were dried at 100° C. for 90 seconds. The film weights were measured after thorough air drying over several days.

TABLE 6

| | Example | | | | |
|---|---|---|---|---|---|
| | 4 | 5 | 6 | 7 | 8 |
| Component | Parts by Weight | | | | |
| Resin A | 28.48 | 28.47 | 28.44 | 28.42 | 28.41 |
| Resin B | 48.60 | 48.55 | 48.51 | 48.49 | 48.46 |
| Acid Generator A | 7.54 | 7.53 | 7.53 | 7.52 | 7.52 |
| IR Dye A | 7.88 | 7.87 | 7.86 | 7.86 | 7.85 |
| Terephthaldehyde | 6.54 | 6.53 | 6.52 | 6.52 | 6.52 |
| Blue Dye B | 0.96 | 1.05 | 1.14 | 1.19 | 1.24 |

Thermal Exposure:

Plate samples were then imaged on the Creo Trendsetter at 55, 64, 77, 96, 129 and 194 mJ/cm$^{-2}$, using an internal solid image pattern (100% exposure). They were then pre-heated in the heavy duty Wisconsin oven (conveyor speed= 2.5 feet/min), at a temperature of 260° F. After processing in a Mercury Mark V processor (containing 9005+ developer at 25° C., processing speed 740 mm/min), the solid density ($D_{max}$) of the thermally exposed, pre-heated and developed plates was measured using an X-rite 408 densitometer. MJ/cm$^{-2}$ Table 7 shows increasing amounts of D11 dye, increase the $D_{max}$ of the coating (i.e., the plate has a faster imaging speed).

TABLE 7

| | $D_{max}$ at stated imaging energy density (mJ/cm$^{-2}$) | | | | | |
|---|---|---|---|---|---|---|
| Example | 55 | 64 | 77 | 96 | 129 | 194 |
| 4 | 0.39 | 0.72 | 0.87 | 0.87 | 0.85 | 0.82 |
| 5 | 0.39 | 0.72 | 0.87 | 0.88 | 0.87 | 0.84 |
| 6 | 0.42 | 0.75 | 0.96 | 0.94 | 0.92 | 0.89 |
| 7 | 0.48 | 0.72 | 0.92 | 0.91 | 0.89 | 0.89 |
| 8 | 0.48 | 0.75 | 0.92 | 0.95 | 0.95 | 0.89 |

The present invention has been described with particular reference the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. An imageable composition comprising:
   an acid curable composition;
   an acid generator; and
   a colorant, wherein the colorant includes a counter anion derived from a non-volatile acid;
   and further comprising an infrared absorber, a photothermal converter material, or both.

2. The composition of claim 1, wherein the acid curable composition comprises:
   a crosslinkable binder; and
   a crosslinking agent.

3. The composition of claim 2, wherein the binder comprises a polymer having at least two reactive groups each independently selected from the group consisting of: hydroxy, carboxylic acid, amine, carbamate, amide, sulfonamide and imide.

4. The composition of claim 2, wherein the binder comprises a polymer having at least two reactive hydroxy groups.

5. The composition of claim 2, wherein the binder comprises a polymer selected from the group consisting of: a polyol, a polyether polyol, a novolak resin, a resole resin, a hydroxyfunctional acrylic resin, a hydroxyfunctional polyester resin, and combinations thereof.

6. The composition of claim 2, wherein the binder comprises a novolak resin.

7. The composition of claim 2, comprising a crosslinking agent selected from the group consisting of: a resole resin, an amino resin, an amido resin, an epoxy compound having at least two epoxide groups, and combinations thereof.

8. The composition of claim 2, wherein the crosslinking agent comprises a resole resin.

9. The composition of claim 2, wherein the crosslinking agent comprises an amino resin having at least two alkoxymethyl groups.

10. The composition of claim 2, comprising an isocyanate crosslinker having at least two isocyanate groups.

11. The composition of claim 1, wherein the acid generator is an ultraviolet, visible or infrared radiation or heat activated compound.

12. The composition of claim 1, comprising an acid generator selected from the group consisting of: an onium salt, a covalently bound sulfonate group-containing compound, hydrocarbylsulfonamido-N-hydrocarbyl sulfonate, and combinations thereof.

13. The composition of claim 1, wherein the acid generator comprises an onium salt.

14. The composition of claim 13, wherein the onium salt has a non-nucleophilic counter anion selected from the group consisting of tetrafluoroborate, hexafluorophosphate, hexafluoroarsenate, hexafluoroantimonate, triflate, tetrakis (pentafluorophenyl)borate, pentafluoroethyl sulfonate, p-methylbenzene sulfonate, ethyl sulfonate, trifluoromethyl acetate and pentafluoroethyl acetate.

15. The composition of claim 13, wherein the onium salt is selected from the group consisting of: an iodoniumn salt, a sulfonium salt, a hydrocarbyloxysulfonium salt, a hydrocarbyloxyammonium salt, an aryl diazonium salt, and combinations thereof.

16. The composition of claim 13, wherein the onium salt is a salt of an N-hydrocarbyloxy-substituted nitrogen-containing heterocyclic compound.

17. The composition of claim 1, wherein the acid generator includes a monomeric or oligomeric aromatic diazonium salt.

18. The composition of claim 17, wherein the diazonium salt is selected from the group consisting of 2-methoxy-4-phenylaminobenzene diazonium hexafluorophosphate, 2-methoxy-4-phenylaminobenzenediazonium p-toluenesulfonate, and combinations thereof.

19. The composition of claim 17, wherein the diazonium salt is an oligomeric diazonium salt represented by one of the structures:

wherein n is from 1 to 11, and combinations thereof.

20. The composition of claim 1, wherein the composition comprises a photothermal converter material.

21. The composition of claim 1, wherein the composition comprises an infrared absorber.

22. The composition of claim 21, wherein the infrared absorber is selected from the group consisting of: a pigment, a dye, and combinations thereof.

23. The composition of claim 21, wherein the infrared absorber includes a dye selected from the group consisting of: cyanine dyes, squarylium dyes, pyrylium salts and nickel thiolate complexes.

24. The composition of claim 21, wherein the infrared absorber includes an infrared-absorbing dye including a counter anion derived from a non-volatile acid.

25. The composition of claim 24, wherein the infrared-absorbing dye includes a counter anion derived from a non-volatile sulfonic acid.

26. The composition of claim 24, wherein the infrared-absorbing dye is represented by the structure:

27. The composition of claim 24, wherein the infrared-absorbing dye is represented by the structure:

28. The composition of claim 1, wherein the colorant includes a counter anion derived from a non-volatile sulfonic acid.

29. The composition of claim 1, wherein the colorant includes a compound represented by the structure:

30. An imageable element comprising:
a substrate; and
an imageable coating on a surface of the substrate, the coating comprising:
an acid curable composition;
an acid generator; and
a colorant, wherein the colorant includes a counter anion derived from a non-volatile acid, and wherein the colorant enhances the visual contrast between image areas and non-image areas after imaging of the imageable element;
and further comprising an infrared absorber, a photothermal converter material, or both.

31. The imageable element of claim 30, wherein the substrate is an aluminum sheet.

32. The imageable element of claim 30, wherein the acid curable composition comprises:
a crosslinkable binder; and
a crosslinking agent.

33. The imageable element of claim 32, wherein the binder comprises a polymer having at least two reactive hydroxy groups.

34. The imageable element of claim 32, wherein the binder comprises a polymer selected from the group consisting of: a polyol, a polyether polyol, a novolak resin, a resole resin, a hydroxyfunctional acrylic resin, a hydroxyfunctional polyester resin, and combinations thereof.

35. The imageable element of claim 32, wherein the binder comprises a novolak resin.

36. The imageable element of claim 32, comprising a crosslinking agent selected from the group consisting of: a resole resin, an amino resin, an amido resin, an epoxy compound having at least two epoxide groups, and combinations thereof.

37. The imageable element of claim 32, wherein the crosslinking agent comprises a resole resin.

38. The imageable element of claim 30, wherein the acid generator is an ultraviolet, visible or infrared radiation or heat activated compound.

39. The imageable element of claim 30, wherein the acid generator comprises an onium salt.

40. The imageable element of claim 39, wherein the onium salt is selected from the group consisting of: an iodonium salt, a sulfonium salt, a hydrocarbyloxysulfonium salt, a hydrocarbyloxyammonium salt, an aryl diazonium salt, and combinations thereof.

41. The imageable element of claim 30, wherein the acid generator includes a monomeric or oligomeric aromatic diazonium salt.

42. The imageable element of claim 30, wherein the imageable coating comprises a pholothermal converter material.

43. The imageable element of claim 30, wherein the imageable coating comprises an infrared absorber.

44. The imageable element of claim 43, wherein the infrared absorber is selected from the group consisting of: a pigment, a dye, and combinations thereof.

45. The imageable element of claim 43, wherein the infrared absorber includes a dye selected from the group consisting of: cyanine dyes, squarylium dyes, pyrylium salts and nickel thiolate complexes.

46. The imageable element of claim 43, wherein the infrared absorber includes an infrared-absorbing dye including a counter anion derived from a non-volatile acid.

47. The imageable element of claim 46, wherein the infrared-absorbing dye includes a counter anion derived from a non-volatile sulfonic acid.

48. The imageable element of claim 30, wherein the colorant includes a counter anion derived from a non-volatile sulfonic acid.

49. The imageable element of claim 30, wherein the colorant includes a compound represented by the structure:

-continued

50. A method of making an imageable element including a substrate and an imageable coating on the substrate, the method comprising the steps of:
contacting a substrate with an imageable composition dissolved or dispersed in a suitable solvent, wherein the imageable composition comprises
an acid curable composition,
an acid generator, and
a colorant, wherein the colorant includes a counter anion derived from a non-volatile acid, and wherein the colorant enhances the visual contrast between image areas and non-image areas after imaging of the imageable element;
and further comprises an infrared absorber, a photothermal converter material, or both; and
drying to remove solvent, leaving an imageable coating on the substrate.

51. A method of producing an imaged element comprising the steps of:
providing a thermally imageable element comprising a substrate and a thermally imageable coating on a surface of the substrate, the coating comprising an acid curable composition, an acid generator, and a colorant, wherein the colorant includes a counter anion derived from a non-volatile acid, and further comprising an infrared absorber or a photothermal converter material;
imagewise exposing the imageable element to heat to produce an exposed element having exposed and unexposed regions of the coating;
baking the exposed element at a temperature and period of time sufficient to produce a cured element; and
contacting the cured element with a developer to remove the unexposed regions of the coating and thereby produce the imaged element: wherein the colorant enhances the visual contrast between image areas and non-image areas of the imaged element.

52. The method of claim 51, wherein the step of imagewise exposing is carried out using an infrared laser.

* * * * *